(12) United States Patent
Fox et al.

(10) Patent No.: US 8,354,678 B1
(45) Date of Patent: Jan. 15, 2013

(54) STRUCTURE AND METHOD FOR FORMING A LIGHT DETECTING DIODE AND A LIGHT EMITTING DIODE ON A SILICON-ON-INSULATOR WAFER BACKSIDE

(75) Inventors: Benjamin A. Fox, Rochester, MN (US); Nathaniel J. Gibbs, Iowa City, IA (US); Andrew B. Maki, Rochester, MN (US); David M. Onsongo, Austin, TX (US); Trevor J. Timpane, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/179,948

(22) Filed: Jul. 11, 2011

(51) Int. Cl.
*H01L 29/15* (2006.01)
(52) U.S. Cl. ... 257/77; 257/287; 257/292; 257/E29.313; 257/E21.447
(58) Field of Classification Search .................. 257/77, 257/287–292, E29.313, E21.447
See application file for complete search history.

(56) References Cited

U.S. PATENT DOCUMENTS

| | | | |
|---|---|---|---|
| 4,732,646 A | 3/1988 | Elsner et al. | |
| 5,510,655 A | 4/1996 | Tanielian | |
| 5,610,085 A * | 3/1997 | Yuan et al. | 438/187 |
| 5,889,298 A * | 3/1999 | Plumton et al. | 257/285 |
| 6,313,482 B1 * | 11/2001 | Baliga | 257/77 |
| 6,342,717 B1 * | 1/2002 | Komatsu | 257/347 |
| 6,475,864 B1 * | 11/2002 | Sato et al. | 438/268 |
| 6,555,441 B2 | 4/2003 | Ouellet | |

(Continued)

FOREIGN PATENT DOCUMENTS

EP    0769726 A2    4/1997

(Continued)

OTHER PUBLICATIONS

Baron, Jerome. "Back-side illumination, wafer-scale optics drive 2X-5X jump in CMOS image sensor performance," Electro IQ, May 24, 2010; date printed Apr. 6, 2011 <http://www.electroiq.com/index/display/nanotech-article-display/6230277740/articles/small-times/nanotechmes/mems/sensors/2010/may/back-side-illumination.html>.

(Continued)

*Primary Examiner* — N Drew Richards
*Assistant Examiner* — Ankush Singal
(74) *Attorney, Agent, or Firm* — Abdul-Samad A. Adediran; Robert Williams (57) ABSTRACT

A structure and method for fabricating a light emitting diode and a light detecting diode on a silicon-on-insulator (SOI) wafer is provided. Specifically, the structure and method involves forming a light emitting diode and light detecting diode on the SOI wafer's backside and utilizing a deep trench formed in the wafer as an alignment marker. The alignment marker can be detected by x-ray diffraction, reflectivity, or diffraction grating techniques. Moreover, the alignment marker can be utilized to pattern openings and perform ion implantation to create p-n junctions for the light emitting diode and light detecting diode. By utilizing the SOI wafer's backside, the structure and method increases the number of light emitting diodes and light detecting diodes that can be formed on a SOI wafer, enables an increase in overall device density for an integrated circuit, and reduces attenuation of light signals being emitted and detected by the diodes.

22 Claims, 5 Drawing Sheets

U.S. PATENT DOCUMENTS

| | | | |
|---|---|---|---|
| 6,943,429 B1 | 9/2005 | Glenn et al. | |
| 6,979,866 B2 * | 12/2005 | Azuma et al. | 257/347 |
| 7,292,339 B2 | 11/2007 | Lof | |
| 7,420,676 B2 | 9/2008 | Lof et al. | |
| 7,485,508 B2 | 2/2009 | Dyer et al. | |
| 7,772,647 B2 * | 8/2010 | Anderson et al. | 257/348 |
| 8,030,726 B2 * | 10/2011 | Sumi | 257/447 |
| 2003/0030058 A1 * | 2/2003 | Satoh et al. | 257/77 |
| 2004/0108552 A1 * | 6/2004 | Azuma et al. | 257/347 |
| 2005/0118532 A1 | 6/2005 | Mallmann et al. | |
| 2005/0280061 A1 * | 12/2005 | Lee | 257/296 |
| 2007/0063217 A1 * | 3/2007 | Brogan et al. | 257/133 |
| 2009/0108303 A1 * | 4/2009 | Pfirsch | 257/287 |
| 2009/0108314 A1 * | 4/2009 | Cai et al. | 257/301 |
| 2009/0194842 A1 * | 8/2009 | OHara | 257/506 |
| 2010/0224876 A1 | 9/2010 | Zhu | |
| 2010/0264474 A1 * | 10/2010 | Iwabuchi et al. | 257/292 |
| 2010/0283128 A1 * | 11/2010 | Chen | 257/620 |
| 2010/0314702 A1 * | 12/2010 | Sasaki et al. | 257/421 |
| 2011/0156111 A1 * | 6/2011 | Iwabuchi et al. | 257/292 |
| 2011/0169129 A1 * | 7/2011 | Basker et al. | 257/530 |

FOREIGN PATENT DOCUMENTS

| | | |
|---|---|---|
| EP | 0769726 A3 | 11/1997 |

OTHER PUBLICATIONS

IBM, "Silicon Integrated Nanophotonics," URL last updated Dec. 27, 2010; date printed Mar. 24, 2011 <http://domino.research.ibm.com/comm/research_projects.nsf/pages/photonics.index.html>.

"Sony and Omnivision to develop BSI architectures for CMOS image sensor markets," I-Micronews, Jun. 16, 2008; date printed Mar. 24, 2011 <http://www.i-micronews.com/lectureArticle.asp?id=1607>.

Du Plessis et al.; "Silicon LEDs Fabricated in Standard VLSI Technology as Components for All Silicon Monolithic Integrated Optoelectronic Systems," IEEE Journal of Selected Topics in Quantum Electronics, vol. 8, No. 6, pp. 1412-1419, Nov./Dec. 2002.

* cited by examiner

STRUCTURE AND METHOD FOR FORMING A LIGHT DETECTING DIODE AND A LIGHT EMITTING DIODE ON A SILICON-ON-INSULATOR WAFER BACKSIDE

TECHNICAL FIELD

The present invention relates to light detecting diodes and light emitting diodes, and particularly to a structure and method for forming a light detecting diode and a light emitting diode on a silicon-on-insulator wafer backside.

BACKGROUND

Integrated circuit inputs and outputs are provided through controlled collapse chip connections (C4s). As integrated circuits become smaller, increasing the number of C4s that can be placed on the integrated circuits is becoming a challenge. The challenge arises because the number of inputs and outputs (port density) desired for integrated circuits is increasing, but wafer surface area that is available for forming the inputs and outputs is decreasing. Increasing port density for integrated circuits can increase the functionality provided by the integrated circuits.

One way to increase port density and provide additional high speed capable inputs and outputs for an integrated circuit is by forming light detecting diodes (i.e., photo-diodes) and light emitting diodes on a wafer. Traditionally, light detecting diodes and light emitting diodes, both also referred to as optical ports, are formed on a front-side of the wafer. In addition, back-end-of-line (BEOL) processing is performed to create BEOL metal wiring and dielectric levels, and C4 pads on the front-side of the wafer. The BEOL metal wiring and dielectric levels, and C4 pads integrate the light detecting diodes and the light emitting diodes with other circuitry (i.e., other semiconductor devices) on the front-side of the wafer. Although a semiconductor structure having light detecting diodes and light emitting diodes on the front-side of the wafer may provide a performance benefit over C4 pads, generally such a semiconductor structure does not completely address the challenge of how to increase port density as technological advancements continue to result in a decrease of available wafer surface area.

Moreover, BEOL processing requires the BEOL metal wiring and dielectric levels to be formed on top of the light detecting diodes, light emitting diodes, and other semiconductor devices that may be formed on the front-side of the wafer. The BEOL dielectric isolates the BEOL metal wiring from certain areas of the wafer. However, the BEOL dielectric can cause a decrease in performance of the semiconductor devices formed on the wafer. Specifically, the BEOL dielectric can cause attenuation of light signals being emitted or detected by the diodes, and the more the BEOL metal wiring the greater the attenuation of the light signals. The attenuation of the light signals described above can decrease the performance of light detecting and light emitting diodes. Accordingly, the challenge of forming a semiconductor structure having a light detecting diode and a light emitting diode that increases port density for an integrated circuit, and reduces attenuation of light signals being emitted and detected by the diodes respectively, continues to persist. Reducing the attenuation can enhance the performance of the diodes and consequently integrated circuits that utilize the diodes.

SUMMARY

The present invention relates to a structure and method for forming a silicon-on-insulator wafer having a backside, wherein a light detecting diode and a light emitting diode are formed on the backside to increase port density and reduce attenuation of light signals that are emitted and detected by the diodes, respectively.

In one aspect, embodiments of the invention provide a diode structure with a silicon-on-insulator wafer, and a method for forming the diode structure with the silicon-on-insulator wafer. The silicon-on-insulator wafer is joined to a dielectric layer. An alignment marker is formed in the silicon-on-insulator wafer. A back-end-of-line metal wiring and dielectric level is formed on the silicon-on-insulator wafer. An alternating n-type and p-type doped region is formed on a backside of the silicon-on-insulator wafer, wherein the alternating n-type and p-type doped region includes an n-well cathode region, a first n-well ohmic contact region, a second n-well ohmic contact region, and an anode region. A group of through-silicon vias is formed that extend through the back-end-of-line metal wiring and dielectric level, the silicon-on-insulator wafer, and the dielectric layer. A group of contacts is formed that connect the group of through-silicon vias to the alternating n-type and p-type doped region.

BRIEF DESCRIPTION OF THE SEVERAL VIEWS OF THE DRAWINGS

The subject matter which is regarded as an embodiment of the present invention is particularly pointed out and distinctly claimed in the claims at the conclusion of the specification. One manner in which recited features of an embodiment of the present invention can be understood is by reference to the following detailed description of embodiments, taken in conjunction with the accompanying drawings in which:

The drawings are not necessarily to scale. The drawings, some of which are merely pictorial and schematic representations, are not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

References in the specification to "one embodiment", "an embodiment", "an example embodiment", "an alternative embodiment", "another embodiment", etc., indicate that the embodiment described may include a particular feature, element, structure, or characteristic, but every embodiment may not necessarily include the particular feature, element, structure, or characteristic. Moreover, such phrases are not necessarily referring to the same embodiment.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

In addition, it will be understood that when an element as a layer, region, dielectric, or substrate is referred to as being "on" or "over", "disposed on", "disposed over", "deposited on", or "deposited over" another element, it can be directly on the other element or intervening elements may also be present. In contrast, when an element is referred to as being "directly on", "directly over", or "disposed proximately to" another element, there are no intervening elements present. Furthermore, it will be understood that when an element as a layer region, dielectric, or substrate is referred to as being "adjacent to" or "disposed adjacent to" another element, it can be directly adjacent to the other element or intervening elements may be present. In contrast, when an element is referred to as being "directly adjacent to" another element, there are no intervening elements present. Moreover, it will be understood that when an element as a layer, region, dielectric, or substrate is referred to as being "on and adjacent to" or "disposed on and adjacent to" another element, it can be directly on and adjacent to the other element or intervening elements may be present. In contrast, when an element is referred to as being "directly on and adjacent to" another element, there are no intervening elements present. Lastly, it will also be understood that when an element is referred to as being "connected", "coupled", "joined", or "proximate" to another element, it can be directly connected, directly coupled, directly joined, or directly proximate to the other element, or intervening elements may be present. In contrast, when an element is referred to as being "directly connected", "directly coupled", "directly joined", or "directly proximate" to another element, there are no intervening elements present.

Embodiments of the present invention provide a silicon-on-insulator (SOI) wafer having a backside, wherein a light detecting diode and a light emitting diode are formed on the backside to increase port density and reduce attenuation of light signals that are emitted and detected by the diodes, respectively. Reducing the attenuation can enhance the performance of the diodes, and consequently integrated circuits that utilize the diodes.

Figure 1:
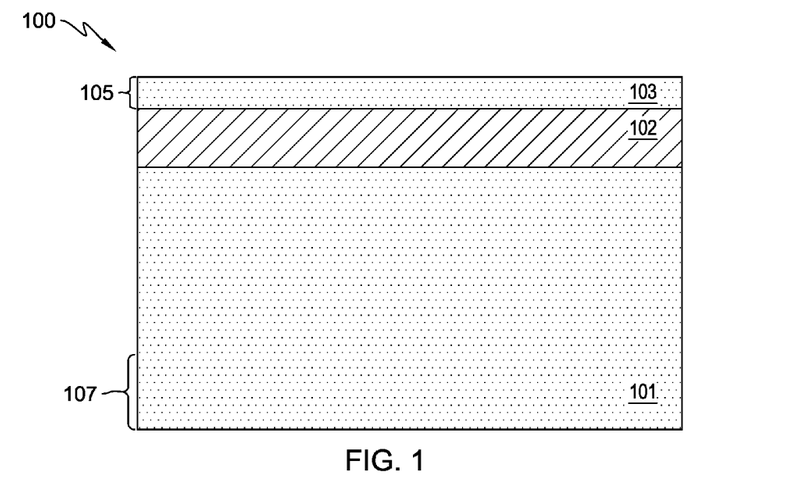
FIGS. 1-7 are cross-sectional views of a silicon-on-insulator wafer having a front-side and a backside, which illustrate process steps for fabricating a light detecting diode and a light emitting diode on the backside according to one embodiment of the present invention.

FIG. 1 illustrates a cross-sectional view of SOI wafer 100. SOI wafer 100, having a front-side 105 and a backside 107, includes a first semiconductor layer 101, a buried insulator layer 102 formed on the first semiconductor layer, and a second semiconductor layer 103 formed on the buried insulator layer. First semiconductor layer 101 and second semiconductor layer 103 are substrates that can include silicon (e.g., single crystal silicon), but are not limited to only silicon based materials. For example, first semiconductor layer 101 and second semiconductor layer 103 may include germanium (Ge), silicon-carbon ($Si_{1-x}C_x$), or other group IV materials. Alternatively, first semiconductor layer 101 may include gallium arsenide (GaAs), aluminum gallium arsenide (AlGaAs), indium arsenide (InAs), or other group III/V materials. In addition, buried insulator layer 102 includes silicon dioxide ($SiO_2$), and the buried insulator layer can be formed in several ways not limited to: ion implantation of oxygen ions into first semiconductor layer 101, followed by a high temperature anneal, this process is commonly referred to as SIMOX (separation by oxygen implantation); bonding oxidized silicon with second semiconductor layer 103 followed by controlled thinning; or growing the second semiconductor layer directly on the insulator. Moreover, buried insulator layer 102 can have a thickness within the range of about 300 nm to 400 nm.

Figure 2:
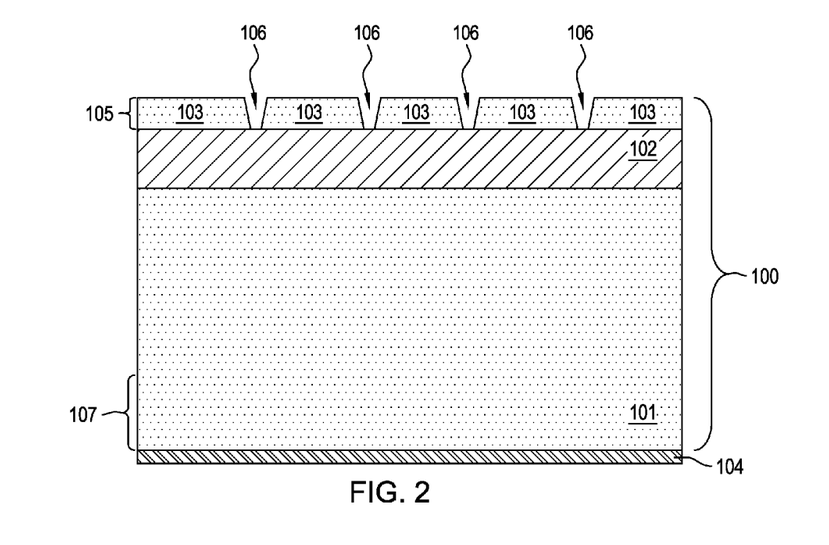

FIG. 2 illustrates a cross-sectional view of SOI wafer 100 with dielectric layer 104 joined to the SOI wafer. Specifically, dielectric layer 104 can be either deposited or thermally grown proximate to first semiconductor layer 101. Low to medium temperature (ranging from about 400° C. to about 650° C.) deposition can be performed utilizing a chemical vapor deposition (CVD) technique, which is preferable for use in a semiconductor fabrication process where there is thermal budget sensitivity. Thermal budget sensitivity refers to a maximum allowed temperature the wafer can be exposed to due to prior process steps. However, where thermal budget is not a concern, thermal growth can be performed at higher temperatures (ranging from about 900° C. to about 1050° C.) in an appropriate $O_2$, $N_2$, $H_2$ ambient. Thus, performing either CVD or thermal growth results in first semiconductor layer 101 being on dielectric layer 104. Dielectric layer 104 is primarily utilized to prevent defects from forming or adhering to first semiconductor layer 101, and provide insulation for the devices formed in subsequent process steps.

Moreover, dielectric layer 104 may include nitride, oxide, or a combination thereof. Nitride is typically utilized to mitigate the diffusion of conductive material (e.g., metal atoms) into the substrates of first semiconductor layer 101 and second semiconductor layer 103. Oxide is typically utilized for adhesion, stress balancing, and as a chemical mechanical planarization (CMP) stop. Shallow trench isolation (STI) openings 106 are formed through second semiconductor layer 103 utilizing reactive ion etching (RIE), selective to buried insulator layer 102. Semiconductor devices can be formed on second semiconductor layer 103, and STI openings 106 can be filled with dielectric material to electrically isolate the semiconductor devices from each other. Utilizing STI openings 106, filled with dielectric material, can mitigate unintended short circuiting, and minimize degradation of electrical characteristics of the semiconductor devices formed on second semiconductor layer 103.

Figure 3:
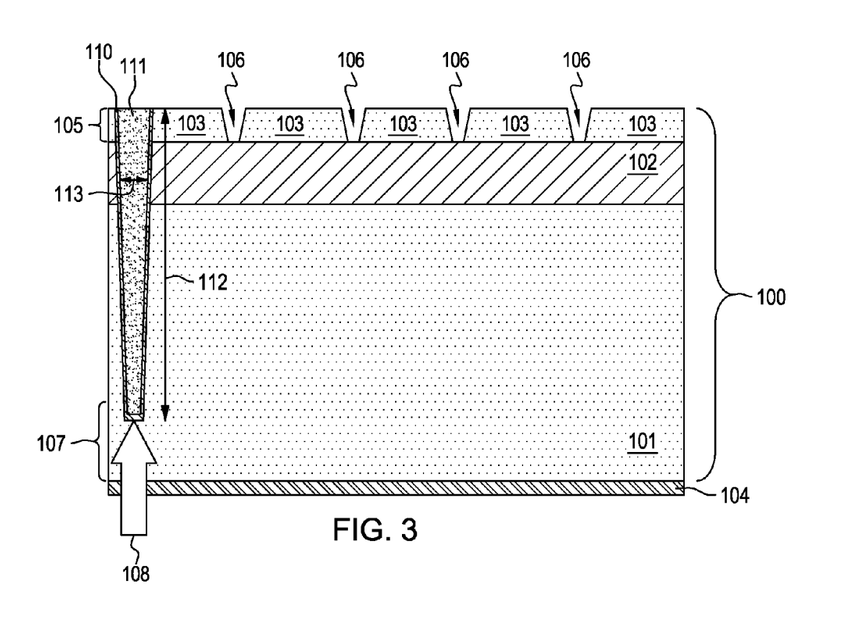

FIG. 3 illustrates a cross-sectional view of SOI wafer 100 having an alignment mark 108 formed through second semiconductor layer 103, buried insulator layer 102, and first semiconductor layer 101. Alignment mark 108 may be, but is not limited to, a deep trench that is filled with a dielectric layer and a conductive material. Specifically, to form alignment mark 108 a first photoresist and/or hardmask layer (not shown) may be deposited on front-side 105. Subsequently, utilizing an etching/removal technique (e.g., anisotropic RIE), an opening for alignment mark 108 can be formed to extend through the first photoresist and/or hardmask layer, second semiconductor layer 103, buried insulator layer 102, and first semiconductor layer 101. The opening can be filled with an alignment mark dielectric layer 110 and conductive material 111. Alignment mark dielectric layer 110 can be deposited on and adjacent to the opening utilizing a CVD technique. Alignment mark dielectric layer 110 can include an oxide such as silicon dioxide ($SiO_2$), a nitride such as silicon nitride (SiN), or a combination thereof. Conductive material 111 can withstand the high thermal budgets associated with conventional complementary metal-oxide-semiconductor (CMOS) front-end-of-line (FEOL) processing. For example, conductive material 111 can include polysilicon, wherein the polysilicon may be deposited on an adjacent to alignment mark dielectric layer 110 utilizing a CVD technique. Moreover, alignment mark dielectric layer 110 can electrically isolate conductive material 111 from portions of first semiconductor layer 101 and second semiconductor layer 103, to mitigate short circuiting between semiconductor devices formed on front-side 105 and on backside 107, of SOI wafer 100.

Subsequently, CMP may be performed to remove the first photoresist and/or hardmask layer, alignment mark dielectric layer 110 and conductive material 111 selective to second semiconductor layer 103, wherein the alignment mark dielectric layer and the conductive material remain only in the opening created for alignment mark 108. Alignment mark 108 can have a length 112 that ranges from about 450 um to about 600 um, and a width 113 that ranges from about 15 um to about 20 um. Specifically, length 112 is about 150 um to 200 um less than the thickness of SOI wafer 100, and the minimum width 113 is constrained by the maximum aspect ratio made possible by the etching/removal process employed to form alignment mark 108. In addition, alignment mark 108 can be subsequently utilized as a point of reference for forming a light detecting and a light emitting diode on backside 107 of SOI wafer 100. Specifically, alignment mark 108 can be utilized to align semiconductor devices formed on backside 107 with semiconductor devices formed on front-side 105 of SOI wafer 100 to enable connection between these devices on either side of the wafer.

Figure 4:
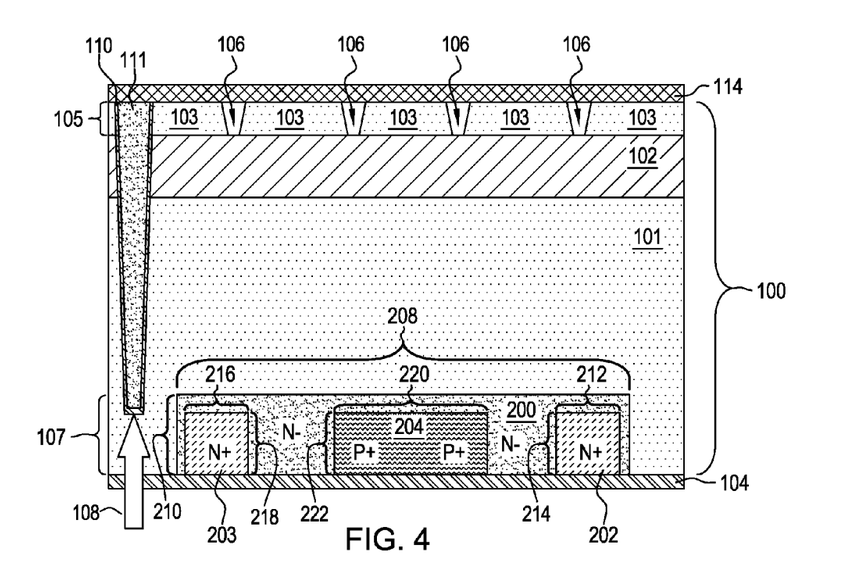

FIG. 4 illustrates additional semiconductors structures for forming a light detecting diode and a light emitting diode on backside 107 of SOI wafer 100. Thus, to form the light detecting diode and the light emitting diode on backside 107, a protective film 114 is deposited on front-side 105 of SOI wafer 100. Protective film 114 can include a spin-on photoresist or a nitride, which may be deposited utilizing techniques that include CVD, physical vapor deposition (PVD), or spin-on approaches. The protective film 114 is required to protect front-side 105, of SOI wafer 100, from defects or impurities while semiconductor devices on backside 107 are being fabricated. Alignment mark 108, which includes alignment mark dielectric layer 110 and conductive material 111, can be utilized as a point of reference to align the semiconductor devices formed on backside 107 with semiconductor devices formed on front-side 105. In the present embodiment, alignment mark 108 is utilized as a point of reference to determine where on backside 107 to perform ion implantation to create an alternating n-type and p-type doped region having p-n junctions for the light detecting diode and the light emitting diode. Specifically, an x-ray diffraction technique or a diffraction grating measurement can be performed to allow for alignment mark 108 to be detected and utilized for aligning semiconductor devices formed on SOI wafer 100.

To form the alternating n-type and p-type region for the light detecting diode and the light emitting diode on backside 107, a lightly doped n-well cathode region 200 is formed on backside 107 utilizing ion implantation of n-type dopants. The n-type dopants utilized to form n-well cathode region 200 can include, but are not limited to, phosphorus, arsenic, or antimony. However, in the present embodiment n-well cathode region 200 is formed utilizing a phosphorus implant having a dopant concentration engineered within the range of about $1 \times 10^{16}$ atoms per cm$^3$ to about $1 \times 10^{18}$ atoms per cm$^3$. The length 208 of n-well cathode region 200 may be about 30 um and the width 210 may be about 1 um. In addition, n-well cathode region 200 may have a depth, into the page, of about 30 um. In the present embodiment, n-well cathode region 200 has a rectangular-like shape. However, in another embodiment n-well cathode region 200 may have a circular-like shape to maximize p-n junction perimeter (i.e., perimeter of anode region 204).

Furthermore, ion implantation is utilized to form heavily doped first n-well ohmic contact region 202 and heavily doped second n-well ohmic contact region 203, within n-well cathode region 200. Specifically, n-well ohmic contact regions 202 and 203 are formed in n-well cathode region 200 on backside 107 utilizing ion implantation of n-type dopants, wherein the n-type dopants can include phosphorus, arsenic, or antimony. However, in the present embodiment n-well ohmic contact regions 202 and 203 are formed utilizing a phosphorus implant having a dopant concentration range of about $5 \times 10^{19}$ atoms per cm$^3$ to about $2 \times 10^{20}$ atoms per cm$^3$. The lengths 212 and 216 of n-well ohmic contact regions 202 and 203 respectively, may be about 0.5 um. Also, the widths 214 and 218 of n-well ohmic contact regions 202 and 203 respectively, may be about 0.5 um. Furthermore, n-well ohmic contact regions 202 and 203 may have a depth into the page of about 28 um. Thus, ohmic contact regions 202 and 203 are encompassed by n-well cathode region 200. In the present embodiment, ohmic contact regions 202 and 203 are separate rectangular bars placed within n-well cathode region 200. However, in another embodiment wherein n-well cathode region 200 has a circular-like shape, ohmic contact regions 202 and 203 would be joined forming a circular-like ring shape within the n-well cathode region.

In addition, a heavily doped p-type anode region 204 is formed in n-well cathode region 200. Specifically, anode region 204 is interposed between n-well ohmic contact regions 202 and 203. The spacing between anode region 204 and n-well ohmic contact regions 202 and 203 can be engineered/tuned for efficiency, however in the present embodiment anode region 204 is spaced about 0.5 um from each of the n-well ohmic contact regions. Ion implantation of p-type dopants is utilized to form anode region 204, wherein the p-type dopants can include, but are not limited to, boron, boron difluoride (BF2) or indium. However, in the present embodiment a BF2 implant is utilized having a dopant concentration range of about $5 \times 10^{19}$ atoms per cm$^3$ to about $2 \times 10^{20}$ atoms per cm$^3$. Moreover, n-well cathode region 200 separates anode region 204 from being directly connected to n-well ohmic contact regions 202 and 203. The length 220 of anode region 204 may be about 26 um, and the width 222 may be about 0.5 um having a depth into the page of about 28 um. Thus, anode region 204 is encompassed by n-well cathode region 200. Accordingly, the final alternating n-type and p-type doped region includes n-well cathode region 200, n-well ohmic contact regions 202 and 203, and anode region 204. In the present embodiment, anode region 204 is a rectangular bar placed within n-well cathode region 200. However, in another embodiment wherein n-well cathode region 200 has a circular-like shape, anode region 204 would also have a circular-like shape within the n-well cathode region, and the anode region would be surrounded by n-well ohmic contact regions 202 and 203 having a circular-like ring shape. After completing ion implantation on backside 107, protective film 114 may be removed by a wet etch or clean to clear the way for forming field effect transistors on front-side 105 of SOI wafer 100.

Figure 5:
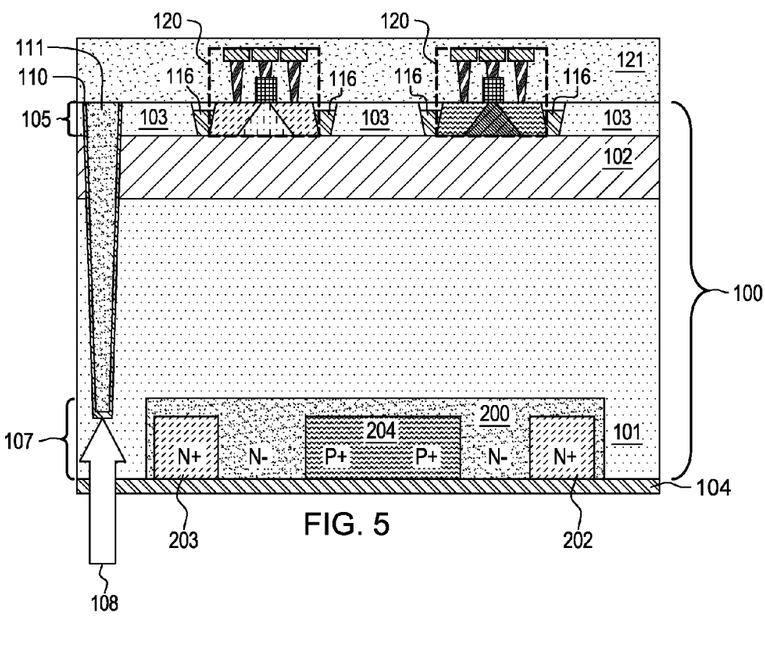

FIG. 5 illustrates the formation of field effect transistors (FETs) 120 on the front-side 105 of SOI wafer 100, but other circuit components that include resistors and capacitors may be formed on the front-side of the SOI wafer. After protective film 114 (shown in FIG. 4) has been removed, conventional or existing SOI processing can be performed. Thus, standard SOI FETs are formed, and STI openings 106 (shown in FIG.

4) are filled with a dielectric material 116 that can include an oxide or a nitride. STI openings 106 once filled are utilized to electrically isolate FETs 120 formed on front-side 105. Formation of FETs 120 and other semiconductor devices and circuit components on front-side 105 is part of FEOL processing. Subsequent to FEOL processing, back-end-of-line (BEOL) processing is performed to create BEOL metal wiring and dielectric levels 121 on front-side 105, and on and adjacent to FETs 120. BEOL metal wiring and dielectric levels 121 can provide a reliable electrical connection/path between FETs 120 and other the semiconductor devices and circuit components formed on front-side 105. Following BEOL processing on front-side 105, TSVs can be formed through BEOL metal wiring and dielectric levels 121, SOI wafer 100, and dielectric layer 104.

Figure 6:
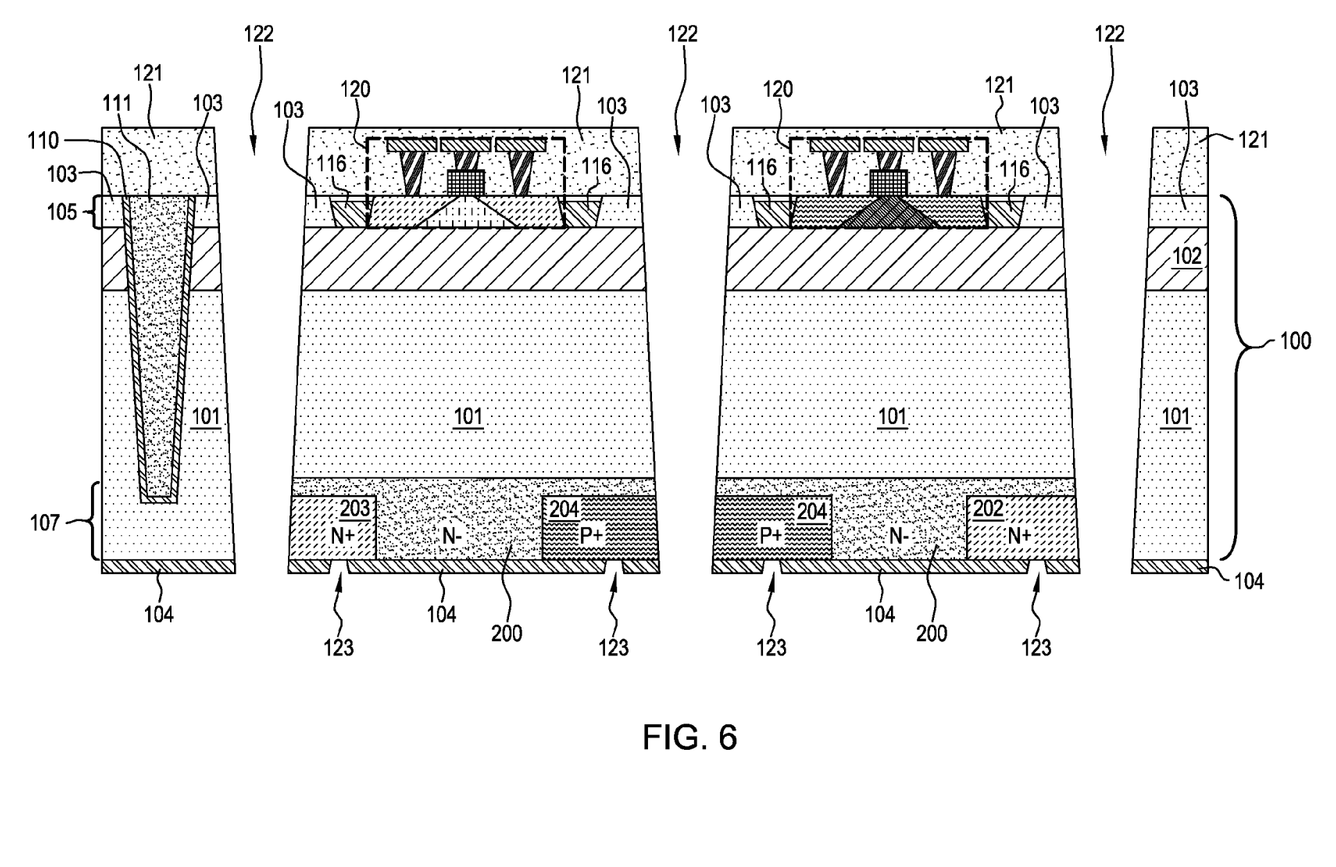

FIG. 6 illustrates the formation of patterned openings 122 and 123. Patterned openings 122 are utilized to create a group of TSVs, and patterned openings 123 clear the way for formation of a group of contacts. The group of TSVs includes first TSV 140, second TSV 141, and third TSV 142 (all shown in FIG. 7). The group of contacts includes first contact 150, second contact 151, and third contact 152 (all shown in FIG. 7). Contacts 150-152 electrically connect TSVs 140-142 to portions of the alternating n-type and p-type doped region on backside 107. TSVs 140-142 are interconnect structures that can electrically connect semiconductor devices and circuit components formed on front-side 105 to semiconductor devices and circuit components formed on backside 107.

To create TSVs 140-142 patterned openings 122 are formed. Moreover, to form patterned openings 122 a second photoresist and/or hardmask layer (not shown) may be deposited on BEOL metal wiring and dielectric levels 121. Subsequently, utilizing an etching/removal technique, patterned openings 122 can be formed to extend through the second photoresist and/or hardmask layer, BEOL metal wiring and dielectric levels 121, second semiconductor layer 103, buried insulator layer 102, first semiconductor layer 101, n-well cathode region 200, n-well ohmic contact regions 202 and 203 or anode region 204, and dielectric layer 104. In addition, a third photoresist and/or hardmask layer (not shown) may be deposited proximate to dielectric layer 104, and patterned openings 123 may be formed through the third photoresist and/or hardmask layer and the dielectric layer, selective to n-well ohmic contact regions 202 and 203 and anode region 204. The etching/removal technique utilized to create patterned openings 122 and 123 can include, but is not limited to, dry etching, plasma etching, or reactive ion etching (RIE). In the present embodiment, patterned openings 122 and 123 are created by performing an anisotropic RIE of BEOL metal wiring and dielectric levels 121, SOI wafer 100, and dielectric layer 104. Patterned openings 122 and 123 are created to clear the way for formation of TSVs 140-142 and contacts 150-152, respectively. After patterned openings 122 and 123 are created, CMP may be performed to remove the second photoresist and/or hardmask layer and third photoresist and/or hardmask layer.

Figure 7:
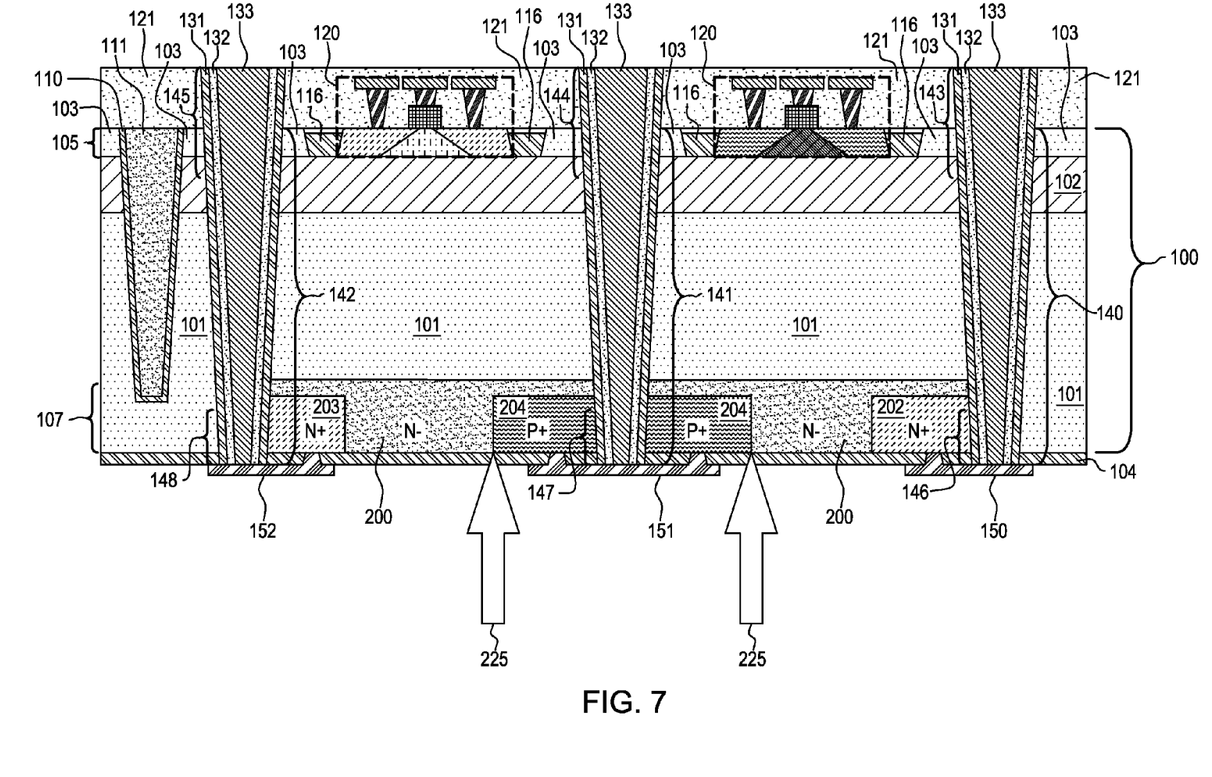

FIG. 7 illustrates the formation of contacts 150-152 and TSVs 140-142, wherein the TSVs have a corresponding first end 143-145 respectively, and a corresponding second end 146-148 respectively. Patterned openings 122 (shown in FIG. 6) may be filled with a dielectric material and a conductive material to create the final structure of TSVs 140-142. Specifically, a dielectric layer 131 having a thickness of about 10 nm is deposited directly adjacent to sidewalls of patterned openings 122 utilizing a CVD technique. Dielectric layer 131 can include an oxide such as silicon dioxide, a nitride such as silicon nitride, or a combination thereof. Thus, dielectric layer 131 can electrically isolate conductive material subsequently formed inside patterned openings 122, from portions of first semiconductor layer 101 and second semiconductor layer 103 to mitigate short circuiting.

A diffusion bather layer 132 having a thickness of about 10 nm may be deposited directly adjacent to dielectric layer 131 utilizing a deposition technique that can include CVD, PVD, or atomic layer deposition (ALD). Diffusion barrier layer 132 can include tantalum (Ta), tantalum nitride (TaN), ruthenium (Ru), titanium (Ti), titanium nitride (TiN), or other materials that are capable of mitigating conductive material (e.g., copper or aluminum) from diffusing into first semiconductor layer 101 and second semiconductor layer 103. Diffusion of conductive material into first semiconductor layer 101 and second semiconductor layer 103 can result in degradation of the electrical characteristics of any semiconductor devices formed on the first semiconductor layer and the second semiconductor layer.

After deposition of diffusion barrier layer 132, conductive material 133 can be deposited inside patterned openings 122 and adjacent to the diffusion barrier layer to fill the remaining unfilled portions of the patterned openings. Conductive material 133 can include, but is not limited to, copper or aluminum. Conductive material 133 can be deposited in patterned openings 122 utilizing deposition techniques that can include CVD, PVD, or spin-on approaches. Afterwards, a CMP process can be performed selective to BEOL metal wiring and dielectric levels 121, wherein dielectric layer 131, diffusion barrier layer 132, and conductive material 133 remain in patterned openings 122 after the CMP process is completed. The filled patterned openings 122 are referred to as TSVs. Thus, TSVs 140-142 can each have an aspect ratio that can range from about 25:1 to 35:1. Aspect ratio refers to the ratio of the depth of a TSV to the minimum lateral dimension of the TSV. TSVs 140-142 with high aspect ratios can help increase device density on SOI wafer 100, because such TSVs consume less surface area of the SOI wafer.

Following the formation of TSVs 140-142, contacts 150-152 are formed to provide an electrical connection between semiconductor devices fabricated on front-side 105 (e.g., FETs 120) and semiconductors devices fabricated on backside 107 (e.g., a light detecting diode and a light emitting diode). Specifically, first contact 150 is joined to dielectric layer 104, second end 146 of TSV 140, and first n-well ohmic contact region 202. Second contact 151 is joined to dielectric layer 104, second end 147 of TSV 141, and anode region 204. Lastly, third contact 152 is joined to dielectric layer 104, second end 148 of TSV 142, and second n-well ohmic contact region 203. Conductive material utilized to make contacts 150-152 can include, but is not limited to, copper or aluminum. Moreover, suitable deposition techniques such as ALD or CVD may be employed to form contacts 150-152.

After formation of contacts 150-152 the semiconductor device created on backside 107 of SOI wafer 100 can be utilized either as a light detecting diode or a light emitting diode, depending on the voltage applied through TSVs 140-142. For light emission p-n junctions 225 are reversed biased to the point of avalanche breakdown. For example, a voltage of about 9V can be applied to TSVs 140 and 142 that connect to n-well ohmic contact regions 202 and 203 respectively, and a voltage of about 0V can be applied through TSV 141 that connects to anode region 204 causing the semiconductor device formed on backside 107 to function as a light emitting diode. If the semiconductor device formed on backside 107 functions as a light emitting diode then current will flow from n-well cathode region 200 to anode region 204, which will result in light being emitted from p-n junctions 225. Alternatively, a voltage of about 5V (below avalanche breakdown) can be applied through TSVs 140 and 142 that connect to n-well ohmic contact regions 202 and 203 respectively, and a voltage of about 0V can be applied through TSV 141 that connects to anode region 204 causing the semiconductor device formed on backside 107 to function as a light detecting diode. If the semiconductor device formed on backside 107 functions as a light detecting diode then current will flow from n-well cathode region 200 to anode region 204, which will result in light being detected at p-n junctions 225. Performance of light detection mode can be increased by having an intrinsically doped region adjacent to anode region 204, wherein the intrinsically doped region separates the anode region from n-well cathode region 200.

Furthermore, those skilled in the art will note from the above description, that presented herein is a novel structure and method to form a light detecting diode and light emitting diode on the backside of an SOI wafer. Forming a light detecting diode and a light emitting diode on the backside of an SOI wafer can increase port density for an integrated circuit, and reduce attenuation of light signals being detected and emitted by the diodes respectively. Lastly, the foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A diode structure, comprising:
   a silicon-on-insulator wafer joined to a dielectric layer;
   an alignment marker formed in the silicon-on-insulator wafer;
   a back-end-of-line metal wiring and dielectric level formed on the silicon-on-insulator wafer;
   an alternating n-type and p-type doped region formed on a backside of the silicon-on-insulator wafer, wherein the alternating n-type and p-type doped region includes an n-well cathode region, a first n-well ohmic contact region, a second n-well ohmic contact region, and an anode region;
   a group of through-silicon vias that extend through the back-end-of-line metal wiring and dielectric level, the silicon-on-insulator wafer, and the dielectric layer; and
   a group of contacts that connect the group of through-silicon vias to the alternating n-type and p-type doped region.

2. The diode structure of claim 1, wherein:
   the silicon-on-insulator wafer comprises a first semiconductor layer, a buried insulator layer formed on the first semiconductor layer, a second semiconductor layer formed on the buried insulator layer; and
   the back-end-of-line metal wiring and dielectric level is formed on the second semiconductor layer.

3. The diode structure of claim 1, wherein:
   the alignment mark comprises an opening;
   an alignment mark dielectric layer is deposited on and adjacent to the opening; and
   a conductive material is deposited on and adjacent to the alignment mark dielectric layer.

4. The diode structure of claim 1, wherein:
   the n-well cathode region, the first n-well ohmic contact region, and the second n-well ohmic contact region comprise n-type dopants that include, but are not limited to, phosphorus, arsenic, or antimony; and
   the anode region comprises p-type dopants that include, but are not limited to, boron, boron difluoride (BF2) or indium.

5. The diode structure of claim 1, wherein:
   the group of through-silicon vias comprises a first through-silicon via, a second through-silicon via, and a third through-silicon via;
   the first through-silicon via, the second through-silicon via, and the third through-silicon via comprise a diffusion barrier layer and a conductive material; and
   the group of contacts comprises a first contact, a second contact, and a third contact.

6. The diode structure of claim 2, wherein the first semiconductor layer and second semiconductor layer comprises germanium (Ge), silicon-carbon ($Si_{1-x}C_x$), other group IV materials, gallium arsenide (GaAs), aluminum gallium arsenide (AlGaAs), indium arsenide (InAs), or other group III/V materials.

7. The diode structure of claim 2, wherein:
   the buried insulator layer comprises silicon dioxide ($SiO_2$);
   the buried insulator layer is formed by ion implantation of oxygen ions into the first semiconductor layer; and
   the buried insulator layer has a thickness within the range of about 300 nm to 400 nm.

8. The diode structure of claim 3, wherein:
   the alignment mark dielectric layer includes nitride, oxide, or a combination thereof; and
   the conductive material includes polysilicon.

9. The diode structure of claim 4, wherein:
   the n-well cathode region has a dopant concentration within the range of about $1 \times 10^{16}$ atoms per $cm^3$ to about $1 \times 10^{18}$ atoms per $cm^3$;
   the first n-well ohmic contact region and the second n-well ohmic contact region each have a dopant concentration within the range of about $5 \times 10^{19}$ atoms per $cm^3$ to about $2 \times 10^{20}$ atoms per $cm^3$; and
   the anode region has a dopant concentration within the range of about $5 \times 10^{19}$ atoms per $cm^3$ to about $2 \times 10^{20}$ atoms per $cm^3$.

10. The diode structure of claim 5, wherein:
    the first contact connects the first through-silicon via to the first n-well ohmic contact region, through a patterned opening formed in the dielectric layer selective to the first n-well ohmic contact region;
    the second contact connects the second through-silicon via to the anode region, through a pair of patterned openings formed in the dielectric layer selective to the anode region; and
    the third contact connects the third through-silicon via to the second n-well ohmic contact region, through a patterned opening formed in the dielectric layer selective to the second n-well ohmic contact region.

11. The diode structure of claim 5, wherein:
    the diffusion barrier layer comprises tantalum (Ta), tantalum nitride (TaN), ruthenium (Ru), titanium (Ti), or titanium nitride (TiN) deposited utilizing a technique that includes CVD, physical vapor deposition (PVD), or atomic layer deposition (ALD); and
    the conductive material comprises copper or aluminum.

12. A method of forming a diode structure, the method comprising:
    forming a silicon-on-insulator wafer joined to a dielectric layer;
    forming an alignment marker formed in the silicon-on-insulator wafer;
    forming a back-end-of-line metal wiring and dielectric level on the silicon-on-insulator wafer;

forming an alternating n-type and p-type doped region on a backside of the silicon-on-insulator wafer, wherein the alternating n-type and p-type doped region includes an n-well cathode region, a first n-well ohmic contact region, a second n-well ohmic contact region, and an anode region;

forming a group of through-silicon vias that extend through the back-end-of-line metal wiring and dielectric level, the silicon-on-insulator wafer, and the dielectric layer; and forming a group of contacts that connect the group of through-silicon vias to the alternating n-type and p-type doped region.

13. The method of claim 12, wherein:
the silicon-on-insulator wafer comprises a first semiconductor layer, a buried insulator layer formed on the first semiconductor layer, a second semiconductor layer formed on the buried insulator layer; and
the back-end-of-line metal wiring and dielectric level is formed on the second semiconductor layer.

14. The method of claim 12, wherein:
the alignment mark comprises an opening;
an alignment mark dielectric layer deposited on and adjacent to the opening; and
a conductive material deposited on and adjacent to the alignment mark dielectric layer.

15. The method of claim 12, wherein:
the n-well cathode region, the first n-well ohmic contact region, and the second n-well ohmic contact region comprise n-type dopants that include, but are not limited to, phosphorus, arsenic, or antimony; and
the anode region comprises p-type dopants that include, but are not limited to, boron, boron difluoride (BF2) or indium.

16. The method of claim 12, wherein:
the group of through-silicon vias comprises a first through-silicon via, a second through-silicon via, and a third through-silicon via;
the first through-silicon via, the second through-silicon via, and the third through-silicon via comprise a diffusion barrier layer and a conductive material; and
the group of contacts comprises a first contact, a second contact, and a third contact.

17. The method of claim 13, wherein the first semiconductor layer and second semiconductor layer comprises germanium (Ge), silicon-carbon ($Si_{1-x}C_x$), other group IV materials, gallium arsenide (GaAs), aluminum gallium arsenide (AlGaAs), indium arsenide (InAs), or other group III/V materials.

18. The method of claim 13, wherein:
the buried insulator layer comprises silicon dioxide ($SiO_2$);
the buried insulator layer is formed by ion implantation of oxygen ions into the first semiconductor layer; and
the buried insulator layer has a thickness within the range of about 300 nm to 400 nm.

19. The method of claim 14, wherein:
the alignment mark dielectric layer includes nitride, oxide, or a combination thereof; and
the conductive material includes polysilicon.

20. The method of claim 15, wherein:
the n-well cathode region has a dopant concentration within the range of about $1 \times 10^{16}$ atoms per $cm^3$ to about $1 \times 10^{18}$ atoms per $cm^3$;
the first n-well ohmic contact region and the second n-well ohmic contact region each have a dopant concentration within the range of about $5 \times 10^{19}$ atoms per $cm^3$ to about $2 \times 10^{20}$ atoms per $cm^3$; and
the anode region has a dopant concentration within the range of about $5 \times 10^{19}$ atoms per $cm^3$ to about $2 \times 10^{20}$ atoms per $cm^3$.

21. The method of claim 16, wherein:
the first contact connects the first through-silicon via to the first n-well ohmic contact region, through a patterned opening formed in the dielectric layer selective to the first n-well ohmic contact region;
the second contact connects the second through-silicon via to the anode region, through a pair of patterned openings formed in the dielectric layer selective to the anode region; and
the third contact connects the third through-silicon via to the second n-well ohmic contact region, through a patterned opening formed in the dielectric layer selective to the second n-well ohmic contact region.

22. The method of claim 16, wherein:
the diffusion barrier layer comprises tantalum (Ta), tantalum nitride (TaN), ruthenium (Ru), titanium (Ti), or titanium nitride (TiN) deposited utilizing a technique that includes CVD, physical vapor deposition (PVD), or atomic layer deposition (ALD); and
the conductive material comprises copper or aluminum.

\* \* \* \* \*